United States Patent
Chandra et al.

(10) Patent No.: US 9,760,438 B2
(45) Date of Patent: Sep. 12, 2017

(54) ERROR DETECTION IN STORED DATA VALUES

(71) Applicant: ARM Limited, Cambridge (GB)

(72) Inventors: Vikas Chandra, San Jose, CA (US); Robert Campbell Aitken, San Jose, CA (US)

(73) Assignee: ARM Limited, Cambridge (GB)

( * ) Notice: Subject to any disclaimer, the term of this patent is extended or adjusted under 35 U.S.C. 154(b) by 80 days.

(21) Appl. No.: 14/306,697

(22) Filed: Jun. 17, 2014

(65) Prior Publication Data

US 2015/0363267 A1    Dec. 17, 2015

(51) Int. Cl.
*G06F 11/10* (2006.01)
*G01R 31/3185* (2006.01)
(Continued)

(52) U.S. Cl.
CPC ...... *G06F 11/1076* (2013.01); *G01R 31/3185* (2013.01); *G01R 31/3187* (2013.01);
(Continued)

(58) Field of Classification Search
CPC ............ G06F 11/1076; G06F 11/0727; G06F 11/0751; G06F 11/1032; G06F 11/10; G06F 2201/83; G06F 11/1008; G06F 1/08; G06F 11/1048; G01R 31/318541; G01R 31/318544; G01R 31/3185; G01R 31/318561; G01R 31/318516; G01R 31/318519; G01R 31/3187; G11C 11/419;
(Continued)

(56) References Cited

U.S. PATENT DOCUMENTS 3,699,322 A * 10/1972 Dorr ................ G06F 11/28
377/28
5,090,035 A * 2/1992 Murase ............ G01R 31/31813
307/73

(Continued)

FOREIGN PATENT DOCUMENTS

EP         0 473 819 A1    3/1992

OTHER PUBLICATIONS

Crop et al., Error Detection and Recovery Techniques for Variation-Aware CMOS Computing: A Comprehensive Review, Oct. 11, 2011, Journal of Low Power Electronics and Applications, pp. 334-356.*

(Continued)

*Primary Examiner* — John J Tabone, Jr.
(74) *Attorney, Agent, or Firm* — Pramudji Law Group PLLC; Ari Pramudji

(57) ABSTRACT

A data storage apparatus is provided which has a plurality of data storage units, each respective data storage unit configured to store a respective data bit of a data word. Stored data value parity generation circuitry is configured to generate a parity bit for the data word in dependence on the data bits of the data word stored in the plurality of data storage units. The stored data value parity generation circuitry is configured such that switching within the stored data value parity generation circuitry does not occur when the data word is read out from the plurality of data storage units. Transition detection circuitry is configured to detect a change in value of the parity bit.

16 Claims, 8 Drawing Sheets

(51) Int. Cl.
*G11C 11/419* (2006.01)
*G06F 1/08* (2006.01)
*G01R 31/3187* (2006.01)
*G06F 11/07* (2006.01)

(52) U.S. Cl.
CPC .......... *G01R 31/318516* (2013.01); *G01R 31/318519* (2013.01); *G01R 31/318541* (2013.01); *G01R 31/318544* (2013.01); *G01R 31/318558* (2013.01); *G01R 31/318561* (2013.01); *G06F 1/08* (2013.01); *G06F 11/0727* (2013.01); *G06F 11/0751* (2013.01); *G06F 11/10* (2013.01); *G06F 11/1008* (2013.01); *G06F 11/1032* (2013.01); *G06F 11/1048* (2013.01); *G11C 11/419* (2013.01)

(58) Field of Classification Search
CPC .......... H03K 19/1736; H04W 52/0287; H03M 7/16; H04L 49/90; H04L 49/901; H04L 69/163; H04L 69/16; H04L 69/161; H04L 49/9063
USPC .......................... 714/755, 801, 805
See application file for complete search history.

(56) References Cited

U.S. PATENT DOCUMENTS

| | | | |
|---|---|---|---|
| 5,193,092 A | 3/1993 | Hartoog et al. | |
| 5,434,871 A | 7/1995 | Purdham et al. | |
| 5,523,707 A | 6/1996 | Levy et al. | |
| 5,623,506 A * | 4/1997 | Dell | G06F 11/1044 714/766 |
| 5,719,880 A | 2/1998 | Leung | |
| 5,748,912 A | 5/1998 | Lee | |
| 5,757,823 A * | 5/1998 | Chen | H03M 13/151 714/752 |
| 5,784,427 A * | 7/1998 | Bennett | G06F 7/584 377/72 |
| 5,809,273 A | 9/1998 | Favor et al. | |
| 6,018,304 A * | 1/2000 | Bessios | H03M 7/46 341/58 |
| 6,130,866 A | 10/2000 | Shigenobu et al. | |
| 6,137,734 A * | 10/2000 | Schoner | G11C 29/028 365/194 |
| 6,181,164 B1 | 1/2001 | Miller | |
| 6,262,596 B1 * | 7/2001 | Schultz | H03M 13/09 326/38 |
| 6,266,710 B1 * | 7/2001 | Dittmer | G06F 13/4045 710/1 |
| 6,275,311 B1 * | 8/2001 | Boffi | G06E 1/00 359/107 |
| 6,295,626 B1 * | 9/2001 | Nair | H03M 13/091 714/757 |
| 6,332,173 B2 * | 12/2001 | Typaldos | 710/105 |
| 6,433,725 B1 | 8/2002 | Chen et al. | |
| 6,457,154 B1 * | 9/2002 | Chen | G06F 11/1016 714/768 |
| 6,938,198 B1 * | 8/2005 | Purcell | H03M 13/091 714/758 |
| 7,278,085 B1 * | 10/2007 | Weng | G06F 11/1008 714/766 |
| 7,283,380 B1 | 10/2007 | Srinivasan et al. | |
| 7,589,362 B1 | 9/2009 | Argyres et al. | |
| 8,005,209 B2 * | 8/2011 | Joshi | H04L 9/004 380/255 |
| 8,225,187 B1 * | 7/2012 | Schultz | G06F 11/1004 714/807 |
| 9,122,625 B1 | 9/2015 | Lu et al. | |
| 2003/0058896 A1 * | 3/2003 | Boerker | H04J 3/047 370/532 |
| 2003/0061558 A1 | 3/2003 | Fackenthal et al. | |
| 2004/0078728 A1 * | 4/2004 | Tremblay | G06F 9/3836 714/52 |
| 2004/0117723 A1 | 6/2004 | Foss | |
| 2004/0190357 A1 | 9/2004 | Scheuerlein et al. | |
| 2005/0204274 A1 | 9/2005 | Kamp et al. | |
| 2005/0223208 A1 | 10/2005 | Moran et al. | |
| 2005/0268209 A1 * | 12/2005 | Mann | H03M 13/6572 714/776 |
| 2005/0289441 A1 | 12/2005 | Kawagoe et al. | |
| 2006/0156214 A1 | 7/2006 | Kikutake et al. | |
| 2007/0044045 A1 * | 2/2007 | Zhuang | G06F 17/505 716/102 |
| 2007/0186268 A1 * | 8/2007 | McNeely | H04L 1/0041 725/135 |
| 2007/0250755 A1 * | 10/2007 | Burleson | G06F 11/1008 714/763 |
| 2008/0040519 A1 | 2/2008 | Starr et al. | |
| 2008/0040652 A1 | 2/2008 | Ausserlechner | |
| 2008/0195915 A1 * | 8/2008 | Leonard | H03M 13/091 714/757 |
| 2009/0164870 A1 | 6/2009 | Penton et al. | |
| 2009/0249175 A1 | 10/2009 | Chandra et al. | |
| 2010/0088565 A1 | 4/2010 | Chandra | |
| 2011/0099451 A1 | 4/2011 | Wezelenburg et al. | |
| 2011/0225475 A1 | 9/2011 | Kumar et al. | |
| 2011/0231732 A1 | 9/2011 | Chu | |
| 2011/0320919 A1 * | 12/2011 | Ambroladze | H03M 13/19 714/785 |
| 2012/0240014 A1 * | 9/2012 | Georgakos | G06F 11/1032 714/801 |
| 2012/0303986 A1 | 11/2012 | Flynn et al. | |
| 2013/0283115 A1 * | 10/2013 | Sazeides | G06F 11/1008 714/752 |
| 2014/0070867 A1 * | 3/2014 | Dutton | H03K 5/1534 327/355 |
| 2014/0089769 A1 | 3/2014 | Priebe et al. | |
| 2014/0325303 A1 * | 10/2014 | Yang | G06F 11/10 714/752 |
| 2015/0041625 A1 * | 2/2015 | Dutton | G01T 1/2985 250/208.1 |
| 2015/0248323 A1 * | 9/2015 | Barner | G06F 11/1004 714/807 |
| 2015/0276867 A1 | 10/2015 | Alvarez-Icaza Rivera et al. | |
| 2015/0363268 A1 * | 12/2015 | Chandra | G06F 11/1076 714/801 |
| 2016/0253227 A1 | 9/2016 | Chen et al. | |

OTHER PUBLICATIONS

Das et al., RazorII: In Situ Error Detection and Correction for PVT and SER Tolerance, Jan. 2009, IEEE, vol. 44, No. 1, pp. 32-48.*
Palframan et al., Time Redundant Parity for Low-Cost ,Transient Error Detection, 2011, EDAA, pp. 1-6.*
Bergstra, A Formal Approach to Concurrent Error Detection in FPGA LUTS, Jul. 2012, McMaster University, Canada, pp. 1-83.*
Almukhaizim et al., Concurrent Error Detection Methods for Asynchronous Burst-Mode Machines, Jun. 2007, IEEE, vol. 56, No. 6, pp. 785-798.*
Almukhaizim et al., On Concurrent Error Detection with Bounded Latency in FSMs, 2004, IEEE, pp. 1-6.*
Damm et al., State Assignment for Detecting Erroneous Transitions in Finite State Machines, 2006, IEEE, pp. 1-8.*
Palframan, D.J. et al., "Time Redundant Parity for Low-Cost Transient Error Detection", (2011), 6 pages.
Mitra, S. et al., "Which Concurrent Error Detection Scheme to Choose ?", (printed on Jun. 16, 2014), 10 pages.
Kim, J. et al., "Multi-bit Error Tolerant Caches Using Two-Dimensional Error Coding", IEEE International Symposium on Microarchitecture (MICRO-40), (printed on Jun. 16, 2014), 13 pages.
UKIPO Examination Report; GB 1507706.8; dated Nov. 18, 2016.
UKIPO Examination and Search Report; GB 1507706.8; dated Nov. 30, 2015.
PCT International Search Report and Written Opinion; PCT/GB2016/050500; dated May 2, 2016.
Yoon, et al.; Memory Mapped ECC: Low-Cost Error Protection for Last Level Caches; Proceedings of ISCA'09; ACM; 2009. http://users.ece.utexas.edu/~merez/mme_isca09.pdf.

(56) References Cited

OTHER PUBLICATIONS

Phelps; Constructing an Error Correcting Code; Nov. 9, 2009. http://pages.cs.wisc.edu/~markhill/cs552/Fall2006/handouts/ConstructingECC.pdf.
Parity & Computing Parity; May 10, 2005; http://akbar.marlboro.edu/~mahoney/courses/Fall01/computation/compression/hamming/parity.htm.
Error Detection and Correction; Supplement to Logic and Computer Design Fundamentals 3rd Edition1; Pearson Education; 2004 http://logos.cs.uic.edu/366/notes/ErrorCorrectionAndDetectionSupplement.pdf.

\* cited by examiner

ERROR DETECTION IN STORED DATA VALUES

BACKGROUND OF THE INVENTION

Field of the Invention

The present invention relates to data processing systems. More particularly, this invention relates to data storage apparatuses configured to store data values and having circuitry provided to detect a change in a stored data value.

Description of the Prior Art

It is known that a data value stored in a data storage apparatus may be vulnerable to corruption, for example by a particle strike causing a bit flip in the stored data value. For this reason, prior art data storage apparatuses have been provided with mechanisms for determining if a data value read out from a data storage apparatus has changed in any way since that data value was originally stored. One such mechanism is the provision of parity checking circuitry. The parity checking circuitry is configured such that when a data value is stored in the data storage apparatus, a parity value is generated on the basis of that data value (for example by passing the data value to an XOR tree to generate a single resulting parity bit), which is then stored in association with the data value in the data storage apparatus. When the stored data value is later read out, the individual bits of the data value can again be passed to an identical XOR tree for a comparison parity bit to be generated and the comparison parity bit can then be compared with the parity bit which was stored in association with the data value when that data value was originally stored. If the two parity bit values differ then it is known that a bit flip has occurred within the stored data value and an appropriate response, such as to discard the stored data value or to seek to correct the stored data value, can then be carried out.

An example data storage apparatus 10 configured to behave in this manner is schematically illustrated in FIG. 1. A multi-bit data value is originally received and the bits of this data value are stored in the respective bit cells 11-14 (note that for clarity only four bit cells are illustrated but typically more may be provided), whilst the multi-bit data value is also passed to XOR tree 15 which generates a single bit parity value P which is stored at location 16 in association with the stored data value. When a read access is carried out, the individual bits of the data value are also passed to XOR tree 17 (which is identically configured to XOR tree 15) and the resulting parity bit value is compared by comparison circuitry 18 to the parity bit P read out from parity bit storage 16. If these two values differ then the error flag is asserted.

SUMMARY OF THE INVENTION

Viewed from a first aspect, the present invention provides a data storage apparatus comprising: a plurality of data storage units, each respective data storage unit configured to store a respective data bit of a data word; stored data value parity generation circuitry configured to generate a parity bit for the data word in dependence on the data bits of the data word stored in the plurality of data storage units, wherein the stored data value parity generation circuitry is configured such that switching within the stored data value parity generation circuitry does not occur when the data word is read out from the plurality of data storage units; and transition detection circuitry configured to detect a change in value of the parity bit.

The present technique recognises that the energy consumed in generating the parity bit for comparison with the originally generated parity bit each time a read access is made to the stored data value can be disadvantageous. In particular, it is recognised that read accesses may be performed with significantly greater frequency with respect to the data value than write accesses, and accordingly a significant asymmetry between the energy consumption associated with the generation of the original parity bit and the energy consumption associated with the generation of parity bits for each read access can result. Accordingly, the present technique proposes an arrangement wherein parity generation circuitry is provided which is arranged to generate a parity bit for the stored data word in dependence on the values of the bits of the data word, but wherein no switching within the parity generation circuitry occurs when the data word is read out from the data storage apparatus. A data storage apparatus with lower energy consumption is thus provided, because a parity value is not recomputed each time a read access is performed.

The stored data value parity generation circuitry may be configured such that switching in the stored bit generation circuitry does not occur unless a value of a data bit stored in one of the data storage units changes. Accordingly, the parity computation may be concurrent, i.e. may be carried out as soon as an error occurs in one of the data bits of the stored data value. This is advantageous because not only can an error be flagged as soon as it occurs, but this also assists in preventing the accumulation of errors. This is significant in a data storage apparatus which seeks to combat data errors by the use of a parity value generated on the basis of the stored data value, since if two bits change within a stored data value (or indeed any further even number of bits change) the changes would not be detectable by this parity method, since the parity value would again be the same as the original parity value. The generation of a parity bit which changes as soon one of the data bits within a stored data value changes thus helps to prevent silent data corruption, wherein an even number of multiple bit flips go unnoticed.

In some embodiments the data storage apparatus further comprises write parity bit circuitry configured to generate a write parity bit when a new data word is written into the plurality of data storage units and to store the write parity bit, and the transition detection circuitry is configured to detect the change in value by a comparison of the parity bit for the data word and the stored write parity bit.

The generation of a write parity bit when a new data word is written has the advantage that this write parity bit represents a "snapshot" of the new data word when it was originally received to be written to the data storage units. The arrangement wherein the transition detection circuitry is configured to compare the write parity bit stored with the parity bit being generated by the stored data value parity generation circuitry thus ensures that the stored data value is continually being compared against the original version of the data word. This arrangement also helps to protect against the brief vulnerability of the data storage units to a bit flip going unnoticed because it happened during the write process, when the output of the parity generation circuitry may be temporarily ignored (because of the brief indeterminate state of the content of the data storage units as they are written).

In some embodiments the transition detection circuitry is configured such that switching within the transition detection circuitry does not occur unless the parity bit for the data word changes. This further reduces the energy consumption of the data storage apparatus by providing transition detection circuitry which does not actively consume power until the parity bit for the data word changes.

In some embodiments the data storage apparatus further comprises a write enable signal line configured to carry a write enable signal, wherein the write enable signal is asserted when the data word is being written to the plurality of data storage units, wherein the write enable signal line is coupled to the transition detection circuitry and the transition detection circuitry is disabled when the write enable signal is asserted. The time period where the data word is being written to the plurality of data storage units is recognised as a time period when the parity generation circuitry will briefly be in an indeterminate state, because of the dependency of the parity bit which it generates on the values of the individual data bits of the data word which is being written. Hence as those data bits are written the relative timing of the writing of each individual data bit can cause the parity bit to briefly fluctuate in value. By disabling the transition detection circuitry during the period when the write enable signal is asserted, this enables this brief indeterminate period to be correctly ignored. Hence, the detection of a change in value of the parity bit is then only active during the remaining time period when a genuine error occurring in the stored data value should be detected.

In some embodiments the data storage apparatus is a multi-ported register file, the multi-ported register file comprising a plurality of read ports via which the plurality of data storage units can be read. The present technique recognises that a multi-ported register file represents a data storage apparatus for which the advantages of the present technique are partially pronounced, due to the fact that the provision of the plurality of read ports thus means that the generation of a parity value in association with each read access could potentially happen with significant frequency and avoiding such parity generation in association with each read access, as is provided by the present technique, is particularly advantageous. A multi-ported register file can also be a particularly advantageous context for the implementation of the present technique because of the many interconnects which will typically have to be provided in association with the layout of a multi-ported register file. Hence, although the present technique may require more gates (typically XOR gates) to be provided than a conventional parity generation scheme, for example adding one XOR gate in association with each flip-flop which stores each bit of a data value, this larger gate count does not necessarily mean a larger area for the provision of the register file. This is due to the fact that the layout area of such a multi-ported register file is typically dominated by its interconnects. For example, a contemporary multi-ported register file might have 9 write ports and 14 read ports, meaning that 23 parallel (horizontal) word lines are required for each flip-flop. It has been found in the implementation of such multi-ported register files that these can often be "wire dominated" with significant "white space" in the layout. Since the provision of the parity generation circuitry may add as little as one extra horizontal signal, it is possible to hide the modest extra gate cost in the layout of implementing the present technique, without significantly impacting the area required for the multi-ported register file.

The stored data value parity bit generation circuitry may be provided in a variety of ways. In some embodiments, the stored data value parity generation circuitry comprises a linear concatenation of logic circuitry provided in association with the plurality of data storage units, wherein each logic circuitry has the respective data bit of the respective data storage unit as one of its inputs. A linear concatenation of logic circuitry (for example a chained set of XOR gates with one XOR gate provided in association with each data storage unit), with the data bit stored in each respective data storage unit providing one input for the XOR gate, and the other being provided by the output of the previous XOR gate, advantageously represents only a modest addition to the data storage units themselves. Indeed, it may be possible for the required additional logic circuitry (e.g. an XOR gate) to be folded inside the data storage unit (e.g. a flip-flop) especially if a double height cell in the layout is used.

However, in other embodiments the stored data value parity generation circuitry comprises a hierarchical tree of logic circuitry, wherein logic circuitry at a lowest level of the hierarchical tree each have the respective data bits of pairs of the respective data storage units as its inputs, and wherein logic circuitry at a highest level of the hierarchical tree generates the parity bit for the data word as its output. Such a hierarchy tree of logic circuitry has the advantage that the parity computation latency is reduced, although this is then at the potential cost of some additional horizontal wires in the layout. However, as mentioned above such additional horizontal wires may in fact be of little impact on the layout area in implementations such as a multi-ported register file where existing white space in the layout can absorb these wires. The number of gates in the parity generation logic circuitry (e.g. XOR gates) is typically the same.

In some embodiments having a hierarchical tree of logic circuitry the data storage apparatus further comprises a scan unit configured to receive the parity bit for the data word output at the highest level of the hierarchical tree and to output the parity bit at a scan output of the scan unit in response to a scan out signal. This scan unit thus enables the content of the plurality of data storage units to be observed via a single point in a scan chain. For example a test pattern can be written into the data storage units via the usual (parallel) data path and the resulting parity bit can be scanned out as a single data bit, rather than a sequence of data bits corresponding to the full content of the data storage units.

Whilst it may be the case that the stored data value parity generation circuitry simply generates one parity bit which depends on all of the data bits of the data word, in some embodiments the stored data value parity generation circuitry is configured to generate a sub-parity bit for the data word in dependence on less than all of the data bits of the data word stored in the plurality of data storage units. Due to the fact that fewer data bits are used to generate such a sub-parity bit this also reduces the parity computation latency.

The particular implementation of the generation of a sub-parity bit for the data word may take a number of forms. For example, in one embodiment the stored data value parity generation circuitry is configured to generate a plurality of sub-parity bits for the data word. Accordingly, rather than generating one parity bit for the entirety of the data word, the data word may be subdivided into, for example, two portions and a sub-parity bit may be generated for each of those portions. This allows a finer granularity of determination of where an error has occurred when a change in one of these sub-parity bits is detected by its corresponding transition detection circuitry, and is generally faster than the determination of one parity bit for the whole data word, especially in embodiments where the stored data value parity bit generation circuitry is provided as a linear concatenation.

It may however be the case that a sub-parity bit is generated because a portion of the data word can be disregarded, for example because only another portion of the data word need be monitored for the occurrence of errors. Accordingly in some embodiments the stored data value parity generation circuitry is configured such that at least one of the data bits of the data word stored in the plurality of data storage units does not affect the value of the sub-parity bit.

In some embodiments the data storage apparatus is configured to store a plurality of data words, the stored data value parity generation circuitry is configured to generate a respective parity bit for each of the data words, and the data storage apparatus further comprises combination logic circuitry configured to generate an error flag if any of the respective parity bits changes value. The error flag thus generated can allow appropriate corrective action to be taken, recognising that an error has occurred in one of the plurality of data words stored in the data storage apparatus. Moreover, the present technique recognises that there are situations in which, amongst the plurality of data words, it is more important to recognise that an error has occurred than to be able to identify the specific location at which that data error occurred (i.e. here, the particular data word amongst the plurality of data words which contains the error). For example, in the context of a register file, it may be determined (for example due to the relative infrequency of such errors within one of the data words stored within the plurality of data words stored by the register file) that it is preferable for the entire content of the register file simply to be replaced or updated, instead of seeking to take targeted corrective action with respect to a particular data word (or even a particular data bit).

In some embodiments the data storage apparatus is configured to store a plurality of data words, the stored data value parity generation circuitry is configured to generate a respective parity bit for each of the data words, and the data storage apparatus further comprises an error register configured to hold either a non-error value or an error value, wherein the error register is configured to switch to holding the error value if one or more of the respective parity bits changes value. This configuration provides a "sticky register" which under normal circumstances holds a non-error value, but when any of the respective parity bits changes values configured to switch to holding an error value, and will continue to hold the error value even if further parity bits change value. The error register can therefore be monitored (for example via a polling mechanism) to determine if an error has occurred in any of the plurality of data words stored in the data storage apparatus and, as in the example described above, corrective action can be taken, such as to simply replace or update all of the plurality of data words without seeking to identify further which particular data word caused data word or data words caused the error.

Viewed from a second aspect the present invention provides a method of storing data comprising the steps of: storing respective data bits of a data word in a plurality of data storage units; generating a parity bit for the data word via plural intermediate stages in dependence on the data bits of the data word stored in the plurality of data storage units, wherein switching at the plural intermediate stages does not occur when the data word is read out from the plurality of data storage units; and detecting a change in value of the parity bit.

Viewed from a third aspect the present invention provides a data storage apparatus comprising: means for storing respective data bits of a data word in a plurality of data storage units; means for generating a parity bit for the data word via plural intermediate stages in dependence on the data bits of the data word stored in the plurality of data storage units, wherein switching at the plural intermediate stages does not occur when the data word is read out from the plurality of data storage units; and means for detecting a change in value of the parity bit.

Viewed from a fourth aspect the present invention provides apparatus comprising: a plurality of storage units configured to receive data, wherein the plurality of storage units are configured to output the data in response to a read access; and a parity generator associated with said plurality of storage units, wherein said parity generator is configured to: receive at a plurality of inputs a respective value from each of said plurality of storage units; determine a parity value from said plurality of inputs, wherein determination of the parity value is independent of the read access to the data stored in said plurality of storage units; and output said parity value, said apparatus further comprising: a detector configured to detect a change in said parity value.

The detector may be one of: a transition detector and an active comparator.

The apparatus may further comprise a second parity generator configured to generate a second parity value associated with said data when said data is received by said plurality of storage units.

The second parity value may be stored in a further storage unit associated with said plurality of storage units when said data is received by said plurality of storage units; and said second parity value is read from said further storage unit by said detector for comparison with said parity value in order to detect said change in said parity value.

The parity generator may be configured to generate said parity value after said second parity generator has generated said second parity value.

The apparatus may further comprise a write enable signal line configured to carry a write enable signal, wherein the write enable signal is asserted when said data is being written to the plurality of storage units, the write enable signal line is coupled to the detector, and the detector is disabled when the write enable signal is asserted.

The apparatus may be a multi-ported register file, the multi-ported register file comprising a plurality of read ports via which the plurality of storage units can be read.

The parity generator may comprise a linear concatenation of logic circuitry provided in association with the plurality of storage units, wherein each logic circuitry has the respective data bit of the respective storage unit as one of its inputs.

The parity generator may comprise a hierarchical tree of logic circuitry, wherein logic circuitry at a lowest level of the hierarchical tree each have the respective data bits of pairs of the respective storage units as its inputs, and wherein logic circuitry at a highest level of the hierarchical tree generates the parity value as its output.

The apparatus may further comprise a scan unit configured to receive the parity value output at the highest level of the hierarchical tree and to output the parity value at a scan output of the scan unit in response to a scan out signal.

The parity generator may configured to generate a sub-parity bit in dependence on less than all of the data stored in the plurality of storage units.

The parity generator may be configured to generate a plurality of sub-parity bits for the data stored in the plurality of storage units.

The parity generator is configured such that at least one data bit stored in the plurality of storage units does not affect the value of the sub-parity bit.

The apparatus may be configured to store a plurality of data words, the parity generator may be configured to generate a respective parity bit for each of the data words, and the apparatus may further comprise combination logic circuitry configured to generate an error flag if any of the respective parity bits changes value.

The apparatus may be configured to store a plurality of data words, the parity generator may be configured to generate a respective parity bit for each of the data words, and the apparatus may further comprise an error register configured to hold either a non-error value or an error value, wherein the error register is configured to switch to holding the error value if one or more of the respective parity bits changes value.

Viewed from a fifth aspect the present invention provides a method comprising: storing data in a plurality of storage units; outputting said data from said plurality of storage units in response to a read access; receiving a value from a respective one of said plurality of storage units at a respective one of a plurality of inputs of a parity generator associated with said plurality of storage units; determining a parity value from said plurality of inputs, wherein said determining said parity value is independent of said read access to said data stored in said plurality of storage units; outputting said first parity value; and detecting a change in said parity output and an active comparator.

Viewed from a sixth aspect the present invention provides apparatus comprising: means for storing data in a plurality of storage units; means for outputting said data from said plurality of storage units in response to a read access; means for receiving a value from a respective one of said plurality of storage units at a respective one of a plurality of inputs of means for generating a parity value associated with said plurality of storage units, wherein said means for generating the parity value associated with said plurality of storage units is configured to generate the parity value independent of said read access to said data stored in said plurality of storage units; means for outputting said first parity value; and means for detecting a change in said parity output.

BRIEF DESCRIPTION OF THE DRAWINGS

The present invention will be described further, by way of example only, with reference to embodiments thereof as illustrated in the accompanying drawings, in which.

DESCRIPTION OF THE PREFERRED EMBODIMENTS

Figure 1:
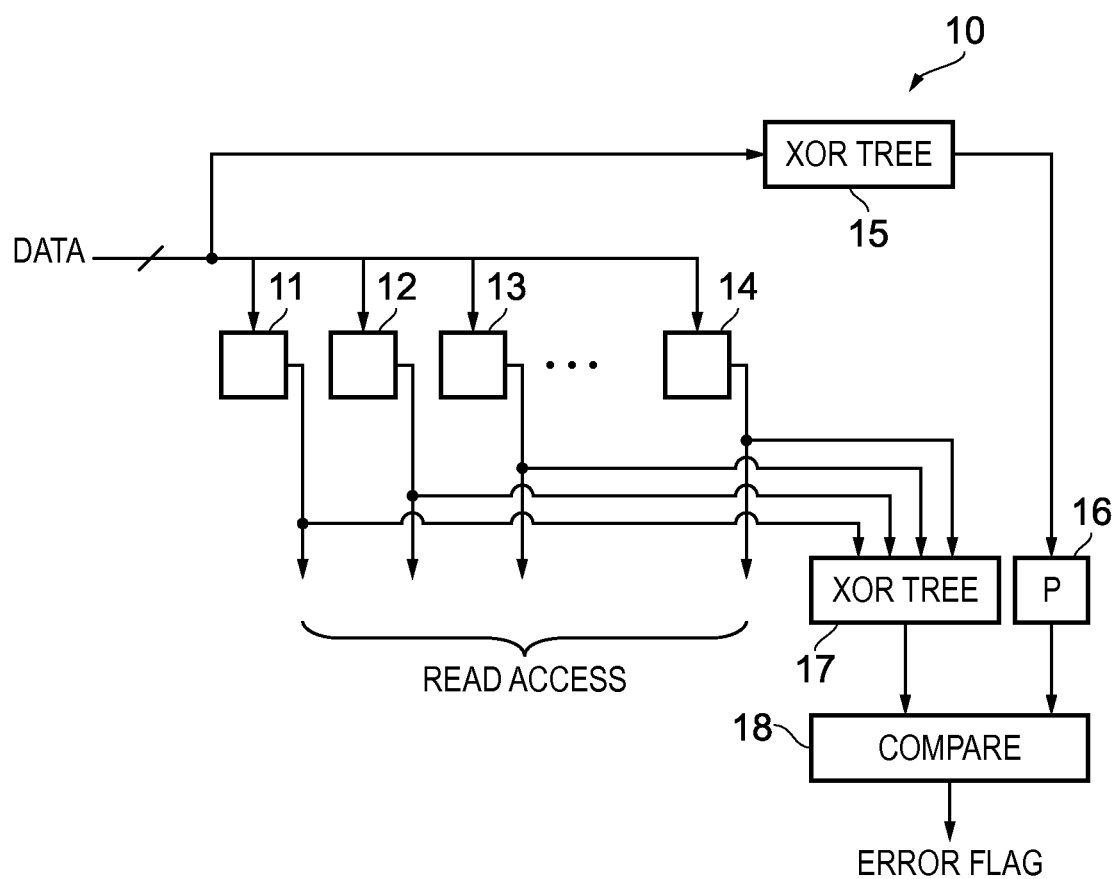
FIG. 1 schematically illustrates the use of parity bit generation to determine if an error has occurred in a stored data value between when it was written and the time it is read out accordingly to a prior art technique.
Figure 2:
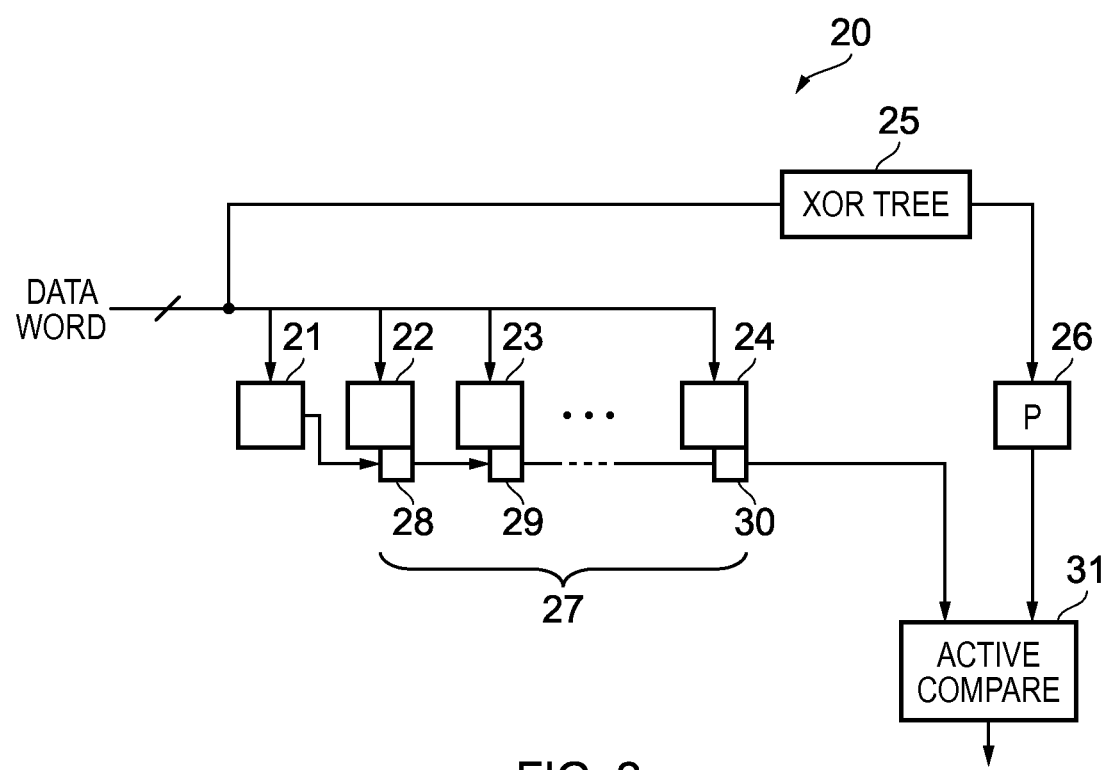
FIG. 2 schematically illustrates a data storage apparatus configured to enable the detection of an error in a stored data value in one embodiment.

FIG. 2 schematically illustrates a data storage apparatus 20 in one embodiment. This data storage apparatus 20 is a register file, provided in close association with a processor unit for the storage of particular data values which the processor unit uses. These data values are stored as data words in the data storage apparatus, wherein in a write operation a data word is written to the storage capacity of the data storage apparatus, this storage capacity being provided by a number of data storage units 21-24, which in this embodiment are provided by a set of flip-flops, each configured to store one bit of the data word. It will be appreciated (in particular by virtue of the fact the data storage units 23 and 24 are separated by a sequence of dots) that the number of bits of the data word to be stored may exceed four, but only four data storage units are shown in FIG. 2 merely for clarity of illustration. Furthermore, the data storage apparatus 20 is configured to store a number of data words, but for clarity of illustration only the storage capacity relating to one data word is shown.

As part of the write process, the data word is also passed to the XOR tree 25 which is configured to generate a single parity bit P in dependence on the respective values of the data bits of the data word. This parity bit P is stored in a parity bit storage location 26 provided in association with the data storage units 21-24 which store the data word itself. Concurrent parity generation circuitry 27 is also provided in association with the data storage units 21-14 which hold the stored data word. In particular, this concurrent parity generation circuitry 27 comprises parity logic units 28-30 which are provided in association with all but the first data storage unit 21 of the data storage units which hold the data word. Each parity logic unit 28-30 is configured to take an input derived from the previous stage of the set of data storage units and to logically combine that input with the value held by the data storage unit with which it is associated. In the embodiment illustrated in FIG. 2 the parity logic units 28-30 are each XOR gates and therefore XOR gate 28 takes the values stored in data storage units 21 and 22 as its inputs, whilst the XOR gate 29 takes the output of XOR 28 as one input and the value stored in data storage unit 23 as its inputs, and XOR gate 30 takes the output from a preceding XOR gate (not illustrated) and the value stored in the data storage unit 24 as its inputs. In this manner, a parity bit is generated which depends on the respective content of the data storage units 21-24. It should be noted in particular that the XOR gates 28-30 are thus arranged to compute the parity bit in real time, independent of any read accesses to the data storage unit 21-24. Whilst the parity bit generated by XOR gates 28-30 will be somewhat indeterminate whilst the data word is being written to the data storage unit 21-24, once the data word has been written, this concurrent parity generation logic will not switch until there is a bit flip in one of the data storage units (or until a new data word is written to the data storage unit). The output of the last XOR gate 30 provides one input to the active compare circuitry 31, which takes the value P stored in parity bit storage 26 as its other input. Active compare circuitry 31 is "active" in the sense that it only switches when one of its inputs changes, for example being provided by a variety of XOR gate.

Figure 3:
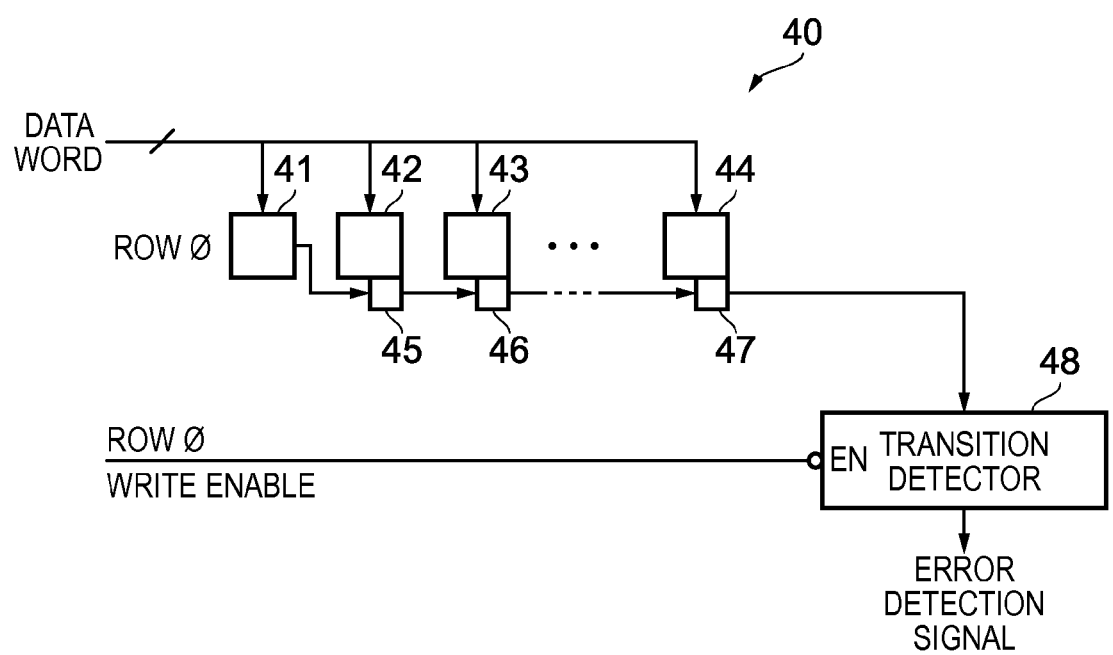
FIG. 3 schematically illustrates a data storage apparatus configured to enable the detection of an error in a stored data value in another embodiment.

FIG. 3 schematically illustrates a data storage apparatus 40 in another embodiment. Like the embodiment shown in FIG. 2, this data storage apparatus 40 is a register file, also provided in close association with a processor unit for the storage of particular data values which the processor unit uses. Also like the embodiment shown in FIG. 2, the data storage apparatus 40 is configured to store a number of data words, but for clarity of illustration only the storage capacity relating to one data word is shown.

Here, as in the case of the embodiment shown in FIG. 2, during a write access a multi-bit data word is written into a set of data storage units 41-44, each of which holds a single bit of the data word. Here however, unlike the embodiment shown in FIG. 2, no parity bit is computed and stored as part of the write operation. However, the concurrent parity generation chain represented by parity logic units 45-47 in FIG. 3 corresponds directly to the concurrent parity chain 27 represented by parity logic units 28-30 in FIG. 2.

In the embodiment shown in FIG. 3, the output of the final component 47 of the concurrent parity chain is received by the transition detector 48, which is configured to detect any changes in this value and to output an error detection signal when such change is detected. The set of data storage units 41-44 in FIG. 3 corresponds to a particular row (row 0) in the data storage apparatus, the data storage apparatus comprising many further rows (not illustrated) of such data storage units into which it can store data words. Writing into a particular row of the data storage apparatus is possible when the corresponding "write enable" signal for that row is asserted (and one of ordinary skill in the art is familiar with the usage of such write enable signals and further detail is not given here for brevity). As illustrated in FIG. 3, the transition detector 48 is also coupled to the write enable signal line, this signal being coupled, inverted, to the enable input of the transition detector 48. This configuration ensures that the transition detection is disabled during the write process, but when the row is not being written, the transition detector is activated. Accordingly, any state change in the row due to an error can then be captured by the transition detector 48. By comparison with the embodiment shown in FIG. 2, this embodiment in FIG. 3 has an advantage in terms of the layout area required, since an additional XOR tree and parity storage unit (items 25 and 26 respectively in FIG. 2) are omitted. However, a feature of the embodiment shown in FIG. 3 is that the row is more vulnerable during the write cycle, since a reference parity bit (such as that stored in parity bit storage unit 26 in FIG. 2) is not part of this FIG. 3 embodiment and there is some potential for corruption occurring during the write process to not be identified. However, given that in many situations the write process will be relatively infrequent, whilst subsequent read processes will be relatively much more frequent, this risk may be determined to be at an acceptably low level. Similarly to the active compare circuitry 31 shown in FIG. 2, the transition detector 48 is configured to only switch when the value of its input (from parity logic unit 47) changes.

Figure 4A:
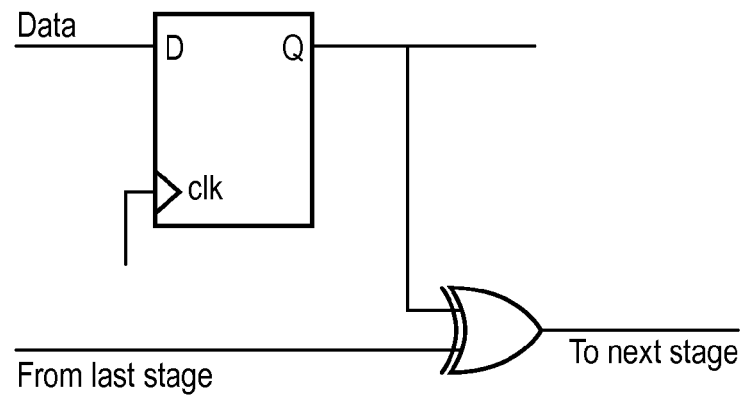
FIGS. 4A and 4B schematically illustrate two embodiments of parity generation circuitry provided in association with a data storage unit.
Figure 4B:
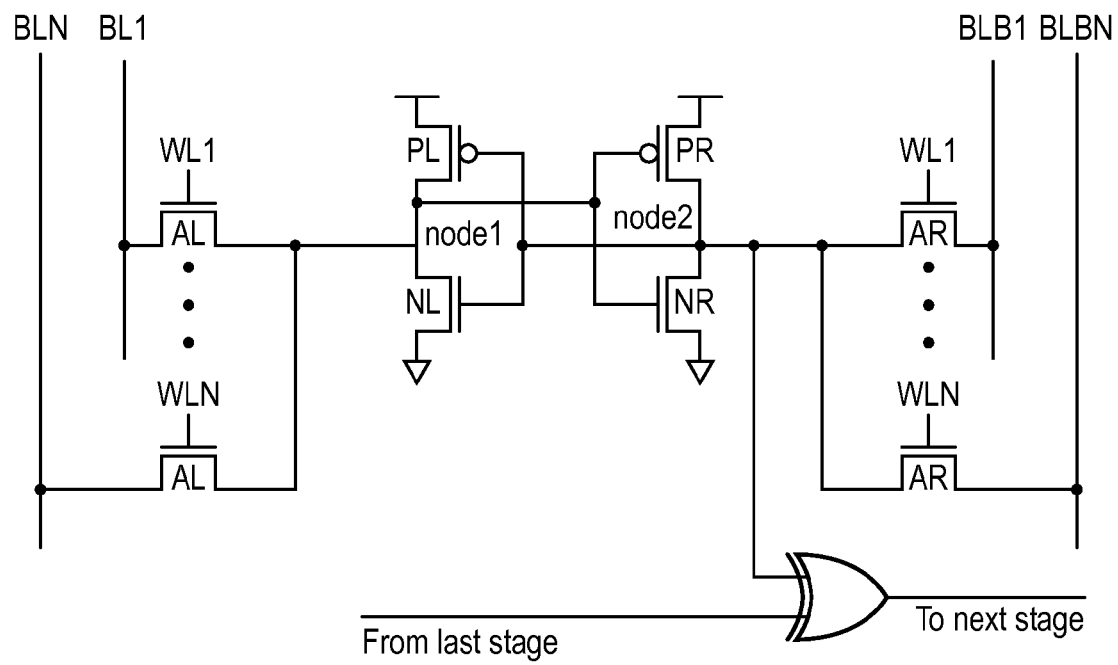

FIGS. 4A and 4B schematically illustrate two example embodiments of an individual data storage unit together with associated parity generation logic, such as for example data storage unit 23 and associated parity generation logic 29 in FIG. 2 or such as data storage unit 43 and its associated parity generation logic 46 in FIG. 3. FIG. 4A schematically illustrates a data storage unit implemented as a flip-flop. Where this flip-flop is provided as a data storage unit within a register file which is implemented in RTL (register-transfer level), the register file may for example be synthesised by a synthesis tool using flip-flops and the concurrent parity detection logic can also be implemented in the RTL. Alternatively, the parity detection logic (in this example the XOR gate) may be provided within the flip-flop itself and the register file may be implemented by a place-and-route technique. The provision of the XOR logic within the flip-flop is particularly possible if a double height flip-flop cell is used. FIG. 4B schematically illustrates an example in which the data storage unit is provided within a custom built bit-cell based register file design.

Figure 5A:
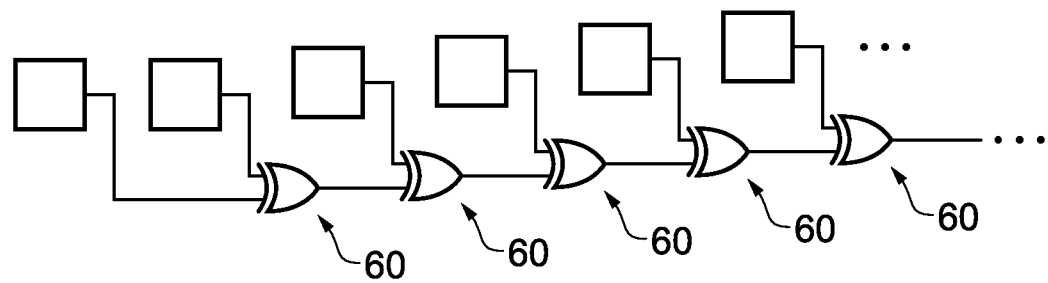
FIG. 5A schematically illustrates the provision of parity generation circuitry as a linear concatenation of XOR gates in one embodiment.
Figure 5B:
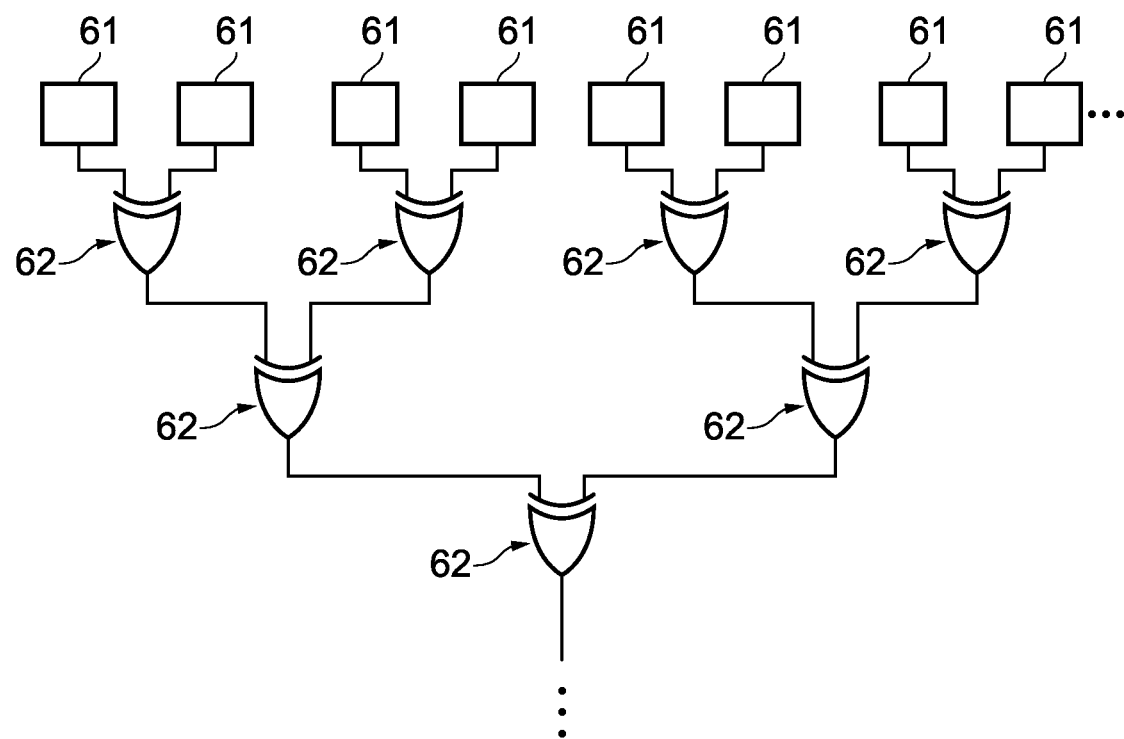
FIG. 5B schematically illustrates the provision of parity generation circuitry as an XOR tree in one embodiment.

FIGS. 5A and 5B schematically illustrates two alternative implementations for providing the concurrent parity detection logic. In FIG. 5A the individual parity detection units (XOR gates 60) are provided as a linear concatenation or chain. By contrast FIG. 5B schematically illustrates the concurrent parity generation logic arranged as a hierarchical tree, in which the XOR gates 62 are arranged in a tree structure with pairs of individual data storage units 61 being compared at a lowest level of the tree and being combined together in an iterative process to generate a final parity bit for the data word stored in the data storage units 61. An advantage of the tree structure shown in FIG. 5B is the reduced parity computation latency with respect to the linear concatenation shown in FIG. 5A, although this comes at the cost of extra horizontal wires.

Figure 6:
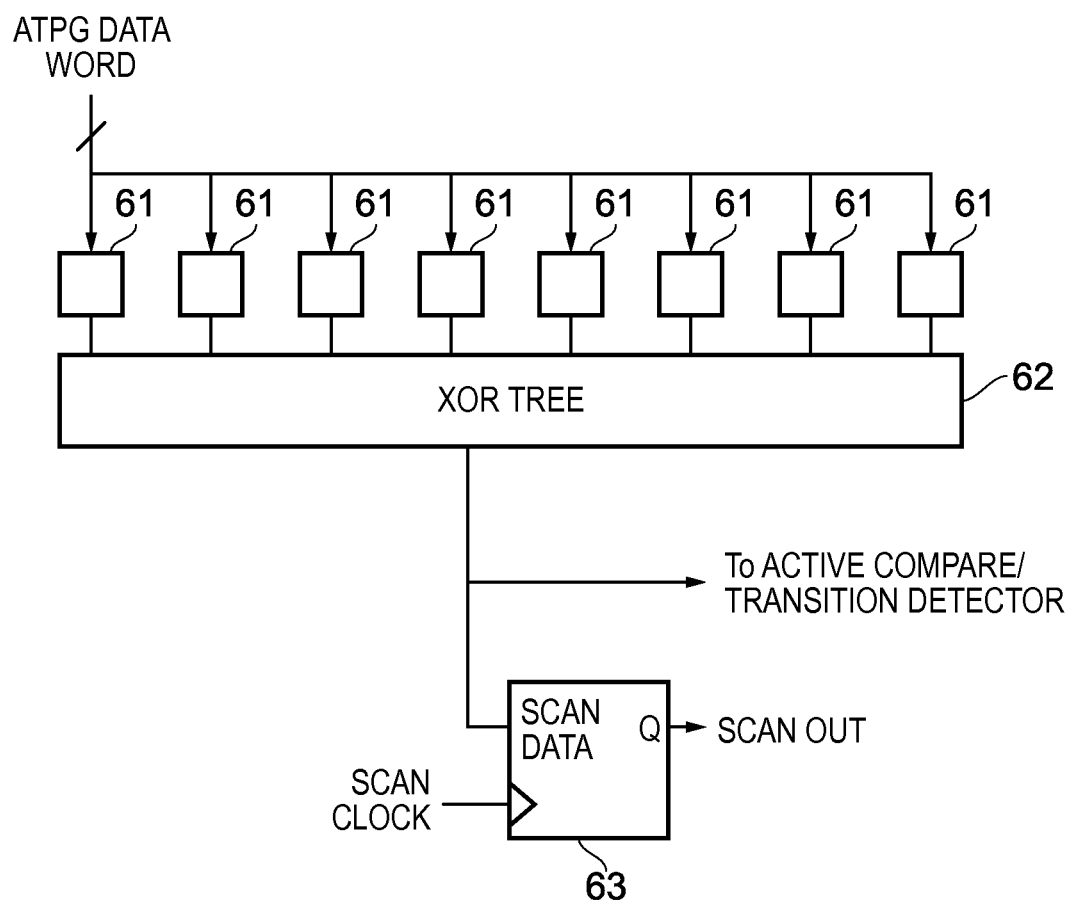
FIG. 6 schematically illustrates the provision of parity generation circuitry as an XOR tree with a scan-flop coupled to the output of the XOR tree in one embodiment.

FIG. 6 schematically illustrates an embodiment related to that illustrated in FIG. 5B, i.e. where the concurrent parity generation logic arranged as a hierarchical tree, in which the output of the XOR tree (gates) 62 is also provided to a scan-flop 63. The scan-flop 63 is configured to provide the output of the XOR tree (i.e. the parity bit) at its output in response to a scan out signal (i.e. here its scan clock input). This enables an automatic test pattern generation (ATPG) data word to be written (in parallel) into the individual data storage units 61 (in the illustrated example these providing an 8-bit data word storage location in a register file), and for the XOR tree 62 to provide observability to each of the flip-flops 61 in the register file. The addition of an observation test point (scan flop 63) to the end of the XOR tree 62 saves having to scan the register file flip-flops 61 out through a scan chain. Standard ATPG can be used to test the register flip-flops 61, for example applying a first pattern in parallel to the register file, followed by applying a second pattern in parallel to the register file. The correct response to flipping bits between subsequent patterns can be observed at the scan output of scan flip-flop 63 to test the register file. Hence the testability of the register file is improved for only a modest increase in area, and indeed at a significant reduction in the number of scan flip-flops by comparison to the usual approach where a chain of scan flip-flops is provided, one being associated with each individual data storage units 61.

Figure 7:
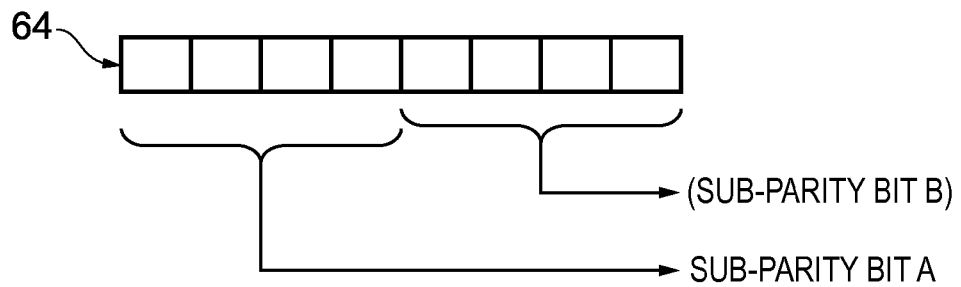
FIG. 7 schematically illustrates the generation of one or more sub-parity bits in one embodiment.

FIG. 7 schematically illustrates a data word 64 for which a parity computation may be performed on less than all of the data word. This is shown in FIG. 7 by the sub-parity bit A which is generated on the basis of the four most significant bits of the data word 64 and the sub-parity bit B which is generated on the basis of the four least significant bits of the data word 64. In some embodiments, both sub-parity bits A and B may be generated, giving full coverage for monitoring the data word 64 for errors and furthermore having a reduced parity computation latency with respect to a single parity bit generated for the whole of the data word 64, since fewer bits are combined to generate each sub-parity bit. This does of course come at the cost of the additional logic required for calculating two sub-parity bits as opposed to a single parity bit. It may instead be the case that only one of the two sub-parity bits illustrated in FIG. 7 is generated, for example only the sub-parity bit A. This can be beneficial in situations where only a portion of the data word 64 requires monitoring for the occurrence of errors, whilst the remaining portion is of lesser significance and errors occurring in this part can be ignored.

Figure 8:
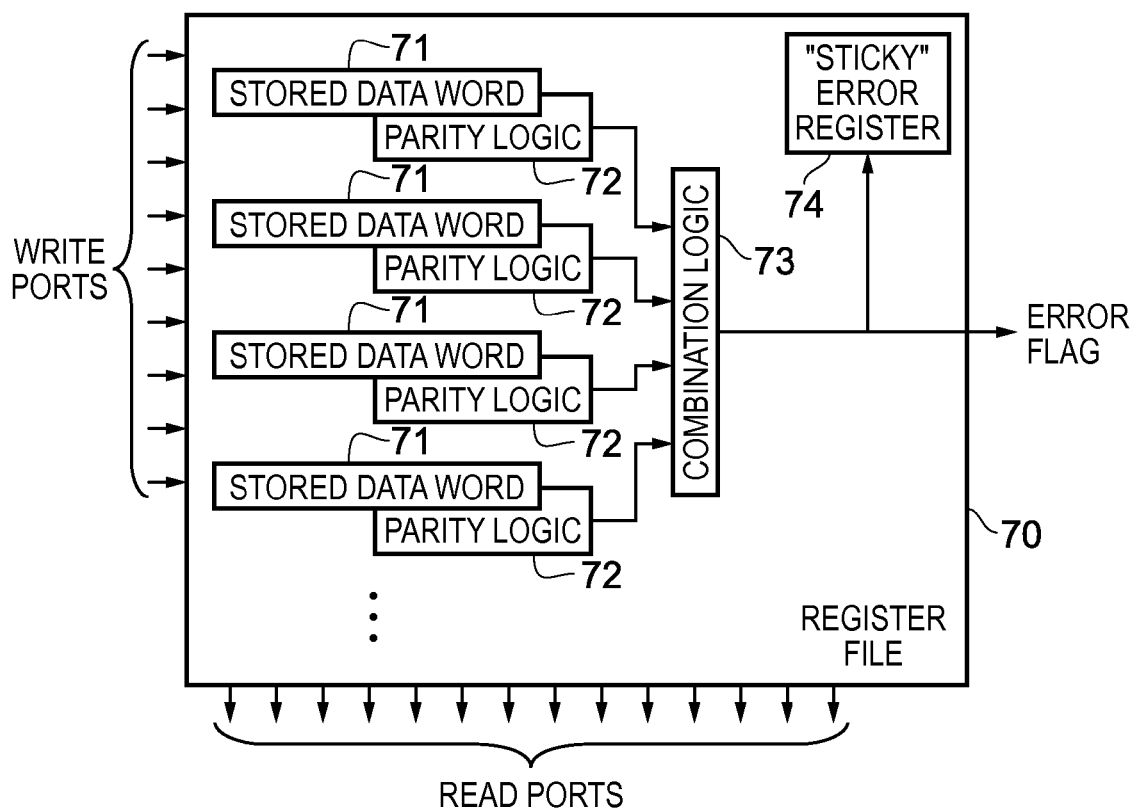
FIG. 8 schematically illustrates a multi-ported register file in one embodiment.

FIG. 8 schematically illustrates a register file 70 which is configured to store a number of data words 71, for example in the embodiment shown in FIG. 8 this is a 128 word register file, wherein each stored data word 71 is an 8-bit word. The register file 70 is a multi-ported register file, having 9 write ports and 14 read ports. The provision of the significant number of read ports makes it particularly advantageous for the parity logic 72 associated with the storage units provided for the storage of each data word 71 to be configured in accordance with the present technique, such that a parity bit for a given stored data word is not generated each time that stored data word is read out. The concurrent parity generation circuitry 72 in FIG. 8 is only schematically shown and may, in more detail, be provided in accordance with the embodiments shown in either FIG. 2 or FIG. 3.

The output of the respective concurrent parity logic units 72 are provided to the combination logic 73 which is configured to combine all of these inputs into a single output ("error flag"), such that the error flag may be asserted if an error is detected by any of the parity logic units 72 for any of the stored data words 71. This thus enables a near-instantaneous notification of an error to be generated and for appropriate corrective action to be rapidly taken. The combination logic 73 may for example be provided by a tree of OR gates, in order to combine the outputs into a single output. Note that the single output to the combination logic 73 is also provided to the "sticky" error register 74. This sticky error register is configured to hold a value indicating a "no error" status until at least one of the outputs of the respective parity logic units 72 changes, this causing the "sticky" error register 74 to change to holding a value indicating an "error" status, which, until this register is reset, will continue to be held regardless of further changes in input values it receives. Note that alternatively the output of each parity logic unit 72 may be directly provided to the "sticky" error register 74, since a change in the parity bit generated by any parity logic unit 72 can be used to cause the "sticky" error register 74 to hold its "error" status value. This sticky error register 74 can thus be monitored, for example by a polling process, to identify when an error has occurred. In the embodiments shown in FIG. 8, the system is configured to react to the error flag (or the error status being held in the register 74) by causing the whole content of the register file 70 to be refreshed when such an error occurs. Accordingly, it should be noted that in this embodiment it is determined to be more efficient to simply re-write the content of the respective stored data words 71, rather than seeking to identify where a particular error occurred and to take corrective action with respect to that particular storage location.

Figure 9:
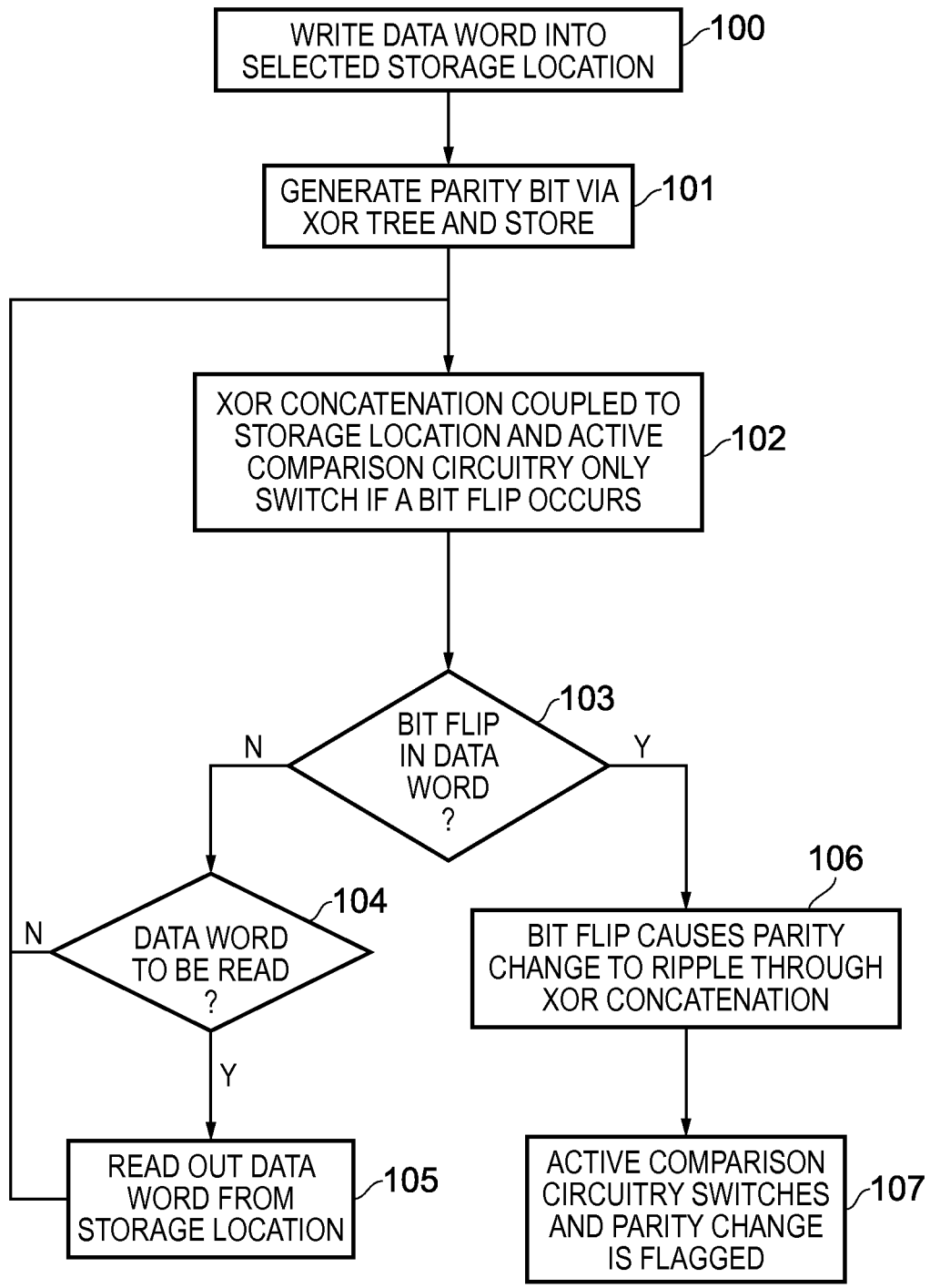
FIG. 9 schematically illustrates a series of steps which are taken in the method of one embodiment.

FIG. 9 schematically illustrates a sequence of steps which are taken in the method of one embodiment. At a first step 100, a write process is carried out to write a data word into its selected storage location (for example by identifying a particular row within a register file into which this data word should be written, asserting the enable signal for that row, and so on). As part of the write process, at step 101 a parity bit is generated via an XOR tree and stored in association with the data word. A status is then set up, as represented by step 102, in which the XOR concatenation coupled to this storage location (concurrent parity generation circuitry) and active comparison circuitry only switch if a bit-flip occurs within the stored data word. Whilst such a bit-flip does not occur in the data word ("No" path from flow step 103), it is determined at step 104 if this data word is to be read. If it is then the flow proceeds via step 105 where the data word is read out from its storage location (and note in particular that this has no effect on the XOR concatenation or active comparison circuitry). The flow then proceeds back to step 102. Alternatively whilst no read is to be carried out ("No" path from step 104) the flow proceeds directly back to step 102. However, when a bit-flip does occur in the data word ("Yes" path from step 103), this bit-flip causes the parity change to ripple through the XOR concatenation (step 106) and, at step 107, this causes the active comparison circuitry to switch and the detected parity change is flagged.

Although particular embodiments of the invention have been described herein, it will be apparent that the invention is not limited thereto, and that many modifications and additions may be made within the scope of the invention. For example, various combinations of the features of the following dependent claims could be made with the features of the independent claims without departing from the scope of the present invention.

We claim:

1. A data storage apparatus comprising:
a plurality of data storage units, each respective data storage unit configured to store a respective data bit of a data word;
stored data value parity generation circuitry configured to generate a parity bit for the data word in dependence on the data bits of the data word stored in the plurality of data storage units, wherein the stored data value parity generation circuitry comprises a plurality of parity logic units, each of the plurality of parity logic units generating the parity bit using data from an associated stage of the plurality of data storage units and a previous stage of the plurality of data storage units,
wherein the stored data value parity generation circuitry is configured such that switching within the stored data value parity generation circuitry occurs independent of the data word being read out from the plurality of data storage units; and
detector circuitry configured to detect a change in value of the parity bit.

2. The data storage apparatus as claimed in claim 1, wherein the stored data value parity generation circuitry is configured such that switching within the stored data value parity generation circuitry does not occur unless a value of a data bit stored in one of the data storage units changes.

3. The data storage apparatus as claimed in claim 1, further comprising write parity bit circuitry configured to generate a write parity bit when a new data word is written into the plurality of data storage units and to store the write parity bit,
and the detector circuitry is configured to detect the change in value by a comparison of the parity bit for the data word and the stored write parity bit.

4. The data storage apparatus as claimed in claim 3, wherein the detector circuitry is configured such that switching within the detector circuitry does not occur unless the parity bit for the data word changes.

5. The data storage apparatus as claimed in claim 1, further comprising a write enable signal line configured to carry a write enable signal, wherein the write enable signal is asserted when the data word is being written to the plurality of data storage units,
wherein the write enable signal line is coupled to the detector circuitry and the detector circuitry is disabled when the write enable signal is asserted.

6. The data storage apparatus as claimed in claim 1, wherein the data storage apparatus is a multi-ported register file, the multi-ported register file comprising a plurality of read ports via which the plurality of data storage units can be read.

7. The data storage apparatus as claimed in claim 1, wherein the stored data value parity generation circuitry comprises a linear concatenation of logic circuitry provided in association with the plurality of data storage units, wherein each logic circuitry has the respective data bit of the respective data storage unit as one of its inputs.

8. The data storage apparatus as claimed in claim 1, wherein the stored data value parity generation circuitry comprises a hierarchical tree of logic circuitry,
wherein the logic circuitry at a lowest level of the hierarchical tree each have the respective data bits of pairs of the respective data storage units as its inputs, and
wherein the logic circuitry at a highest level of the hierarchical tree generates the parity bit for the data word as its output.

9. The data storage apparatus as claimed in claim 8, further comprising a scan unit configured to receive the parity bit for the data word output at the highest level of the hierarchical tree and to output the parity bit at a scan output of the scan unit in response to a scan out signal.

10. The data storage apparatus as claimed in claim 1, wherein the stored data value parity generation circuitry is configured to generate a sub-parity bit for the data word in dependence on less than all of the data bits of the data word stored in the plurality of data storage units.

11. The data storage apparatus as claimed in claim 10, wherein the stored data value parity generation circuitry is configured to generate a plurality of sub-parity bits for the data word.

12. The data storage apparatus as claimed in claim 10, wherein the stored data value parity generation circuitry is configured such that at least one of the data bits of the data word stored in the plurality of data storage units does not affect the value of the sub-parity bit.

13. The data storage apparatus as claimed in claim 1, wherein the data storage apparatus is configured to store a plurality of data words, the stored data value parity generation circuitry is configured to generate a respective parity bit for each of the data words, and
further comprising combination logic circuitry configured to generate an error flag if any of the respective parity bits changes value.

14. The data storage apparatus as claimed in claim 1, wherein the data storage apparatus is configured to store a plurality of data words, the stored data value parity generation circuitry is configured to generate a respective parity bit for each of the data words, and
further comprising an error register configured to hold either a non-error value or an error value, wherein the error register is configured to switch to holding the error value if one or more of the respective parity bits changes value.

15. A method of storing data comprising the steps of:
storing respective data bits of a data word in a plurality of data storage units;
generating a parity bit for the data word via plural intermediate stages in dependence on the data bits of the data word stored in the plurality of data storage units, wherein switching at the plural intermediate stages occurs independent of the data word being read out from the plurality of data storage units;
detecting a change in value of the parity bit; and
asserting a write enable signal when the data word is being written to the plurality of data storage units, wherein detecting the change in value of the parity bit is disabled when the write enable signal is asserted.

16. A data storage apparatus comprising:
means for storing respective data bits of a data word in a plurality of data storage units;
means for generating a parity bit for the data word via plural intermediate stages in dependence on the data bits of the data word stored in the plurality of data storage units, wherein switching at the plural intermediate stages occurs independent of the data word being read out from the plurality of data storage units;
means for detecting a change in value of the parity bit; and
means for asserting a write enable signal when the data word is being written to the plurality of data storage units, wherein detecting the change in value of the parity bit is disabled when the write enable signal is asserted.

* * * * *